United States Patent
Wang et al.

(10) Patent No.: US 9,407,243 B1
(45) Date of Patent: Aug. 2, 2016

(54) RECEIVER CIRCUIT

(71) Applicants: Global Unichip Corporation, Hsinchu (TW); Taiwan Semiconductor Manufacturing Co., Ltd., Hsin-Chu (TW)

(72) Inventors: Wen-Tai Wang, Hsinchu (TW); Sheng-Tsai Huang, Hsinchu (TW)

(73) Assignees: Global Unichip Corporation, Hsinchu (TW); Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/753,029

(22) Filed: Jun. 29, 2015

(51) Int. Cl.
*H03L 3/00* (2006.01)
*H03K 3/356* (2006.01)
*H03K 19/0185* (2006.01)

(52) U.S. Cl.
CPC .. *H03K 3/356086* (2013.01); *H03K 19/018507* (2013.01)

(58) Field of Classification Search
None
See application file for complete search history.

(56) References Cited

U.S. PATENT DOCUMENTS

| | | | | |
|---|---|---|---|---|
| 7,755,394 B2* | 7/2010 | Froehnel | ............ | H03K 19/0013 326/68 |
| 8,970,284 B2* | 3/2015 | Wang | ............ | H03K 19/018521 327/333 |
| 2005/0270066 A1* | 12/2005 | Kozawa | ............ | H03K 3/3565 326/81 |

* cited by examiner

*Primary Examiner* — Long Nguyen
(74) *Attorney, Agent, or Firm* — Jianq Chyun IP Office

(57) ABSTRACT

A receiver circuit including an external terminal, a level shifter, a reset circuit, and an inverting circuit is provided. The external terminal receives the external signal. The level shifter shifts a voltage swing range of the external signal to generate a level shifting signal. The level shifter includes a pull-up unit and a pull-down unit coupled in series. The pull-up unit and the pull-down unit are alternatively switched respectively according to the external signal and the internal signal, and thus a leakage path of the level shifter is cut off for different states of the external signal. The reset circuit couples the external terminal and the level shifter and provides a reset path according to the external signal for assisting the switching of the pull-up unit and the pull-down unit. The inverting circuit couples the level shifter and inverts the level shifting signal to generate the internal signal.

10 Claims, 9 Drawing Sheets

RECEIVER CIRCUIT

BACKGROUND

1. Field of Invention

The present invention generally relates to a receiver circuit, and more particularly to a receiver circuit applying a level shifter with low leakage.

2. Description of Prior Art

Semiconductor chips (dice/integrated circuits) are the most important hardware bases of modern information society. Chips with different functionalities are integrated to form an electronic system with multiple functions, and various chips with different functions exchange data and signals mutually. Signal transmitted and received by chips may have a voltage swing range between 0V and 3.3V, where 3.3V represents high state (i.e., logic 1) and 0V represents low state (i.e., logic 0), so as to construct various circuit operations. However, as semiconductor manufacturing process evolves toward advanced process of deep semi-micron, modern chips adopt low voltage devices (e.g., transistors) to build integrated circuits. In contrasts to the chips having the voltage swing range between 0V and 3.3V, the low voltage devices have a lower voltage swing range between 0V and 1.8V, such as 1.8V low voltage inverters, where 1.8V represents high state and 0V represents low state.

In order to integrate functionalities of various chips so that chips exchange data and signals mutually, each chip includes receiver circuit for receiving signals transmitted from other chip(s) and propagating signals correctly. In a conventional receiver circuit design, level shifter is applied in the receiver circuit for implementing the functionality of shifting the voltage swing range of the received signals to achieve the signal transmission between the circuit board and chips with low voltage devices. However, the conventional level shifter suffers from a current leakage path. The power consumption resulting from a leakage current flowing through the level shifter may be critically increased which leads to high power loss.

SUMMARY

The present invention is directed to a receiver circuit capable of converting an external signal into an internal signal with low leakage.

The present invention is directed to a receiver circuit suitable for receiving an external signal and providing an internal signal in response. The receiver circuit includes an external terminal, a level shifter, a reset circuit, and an inverting circuit. The external terminal is configured to receive the external signal. The level shifter is configured to shift a voltage swing range of the external signal to generate a level shifting signal. The level shifter includes a pull-up unit and a pull-down unit coupled in series. The pull-up unit and the pull-down unit are alternatively switched respectively according to the external signal and the internal signal, and thus cut off a leakage path of the level shifter during different states of the external signal. The reset circuit is coupled to the external terminal and the level shifter. The reset circuit is configured to provide a reset path according to the external signal for assisting the switching of the pull-up unit and the pull-down unit. The inverting circuit is coupled to the level shifter. The inverting circuit inverts the level shifting signal to generate the internal signal.

In an embodiment of the present invention, when the external signal is in a first state, the pull-up unit is turned on and the reset circuit cuts off the reset path respectively in response to the external signal and the pull-down unit is turned off in response to the internal signal so as to generate the level shifting signal with a first supply voltage. When the external signal is in a second state, the pull-up unit is turned off and the reset circuit provides the reset path respectively in response to the external signal and the pull-down unit is turned on in response to the internal signal after the reset path being provided so as to generate the level shifting signal with a ground voltage.

In an embodiment of the present invention, the external signal has a first voltage swing range and the internal signal has a second voltage swing range, the first voltage swing range is defined by a second supply voltage and the ground voltage, and the second voltage swing range is defined by the first supply voltage and the ground voltage.

In an embodiment of the present invention, the first state of the external signal is corresponding to the second supply voltage and the second state of the external signal is corresponding to the ground voltage.

In an embodiment of the present invention, the first supply voltage is less than the second supply voltage, and the receiver circuit is applied in a chip operated in the first supply voltage.

In an embodiment of the present invention, the level shifter includes a first transistor, a resistor, and a second transistor. The first transistor has a first terminal, a second terminal, and a control terminal. The first terminal of the first transistor is coupled to a first supply voltage. The second terminal of the first transistor is coupled to the inverting circuit for outputting the level shifting signal. The control terminal of the first transistor is coupled to the external terminal. The first transistor forms the pull-up unit. The resistor has a first terminal and a second terminal. The first terminal of the resistor is coupled to the second terminal of the first transistor. The second transistor has a first terminal, a second terminal, and a control terminal. The first terminal of the second transistor is coupled to the second terminal of the resistor. The second terminal of the second transistor is coupled to a ground terminal with a ground voltage. The control terminal is coupled to the inverting circuit for receiving the internal signal. The second transistor forms the pull-down unit.

In an embodiment of the present invention, the reset circuit includes a third transistor, a first inverter, and a fourth transistor. The third transistor has a first terminal, a second terminal, and a control terminal. The first terminal of the third transistor is coupled to the external terminal. The control terminal of the third transistor is coupled to the first supply voltage. The first inverter has an input terminal and an output terminal. The input terminal of the first inverter is coupled to the second terminal of the third transistor. The fourth transistor has a first terminal, a second terminal, and a control terminal. The first terminal of the fourth transistor is coupled to the second terminal of the resistor and the first terminal of the second transistor. The second terminal of the fourth transistor is coupled to the ground terminal. The control terminal is coupled to the output terminal of the first inverter. The fourth transistor forms the reset path.

In an embodiment of the present invention, when the external signal is in a first state, the fourth transistor is turned off in response to output of the first inverter so as to cut off the reset path, and when the external signal is in a second state, the fourth transistor is turned on in response to the output of the first inverter so as to provide the reset path.

In an embodiment of the present invention, the inverting circuit includes a second inverter. The second inverter has an input terminal and an output terminal. The input terminal is coupled to the second terminal of the first transistor and the first terminal of the resistor. The output terminal of the second inverter is coupled to the control terminal of the second transistor for outputting the internal signal.

In an embodiment of the present invention, the receiver circuit further includes a voltage limiter. The voltage limiter has an input terminal and an output terminal. The input terminal of the voltage limiter is coupled to the external terminal. The output terminal of the voltage limiter is coupled to the level shifter and the reset circuit. The voltage limiter limits a voltage swing of the external signal and outputs a limited external signal to the level shifter and the reset circuit.

Accordingly, the embodiments of the present invention provides a receiver circuit capable of converting an external signal into an internal signal with low leakage by utilizing a level shifter having a pull-up unit and a pull-down unit. Since the pull-up unit and the pull-down unit are alternatively switched in response to the external signal and the internal signal, the leakage path of the level shifter can be always cut off and thus reduce the power loss leaked through the level shifter.

It is to be understood that both the foregoing general description and the following detailed description are exemplary, and are intended to provide further explanation of the invention as claimed.

BRIEF DESCRIPTION OF THE DRAWINGS

The accompanying drawings, are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
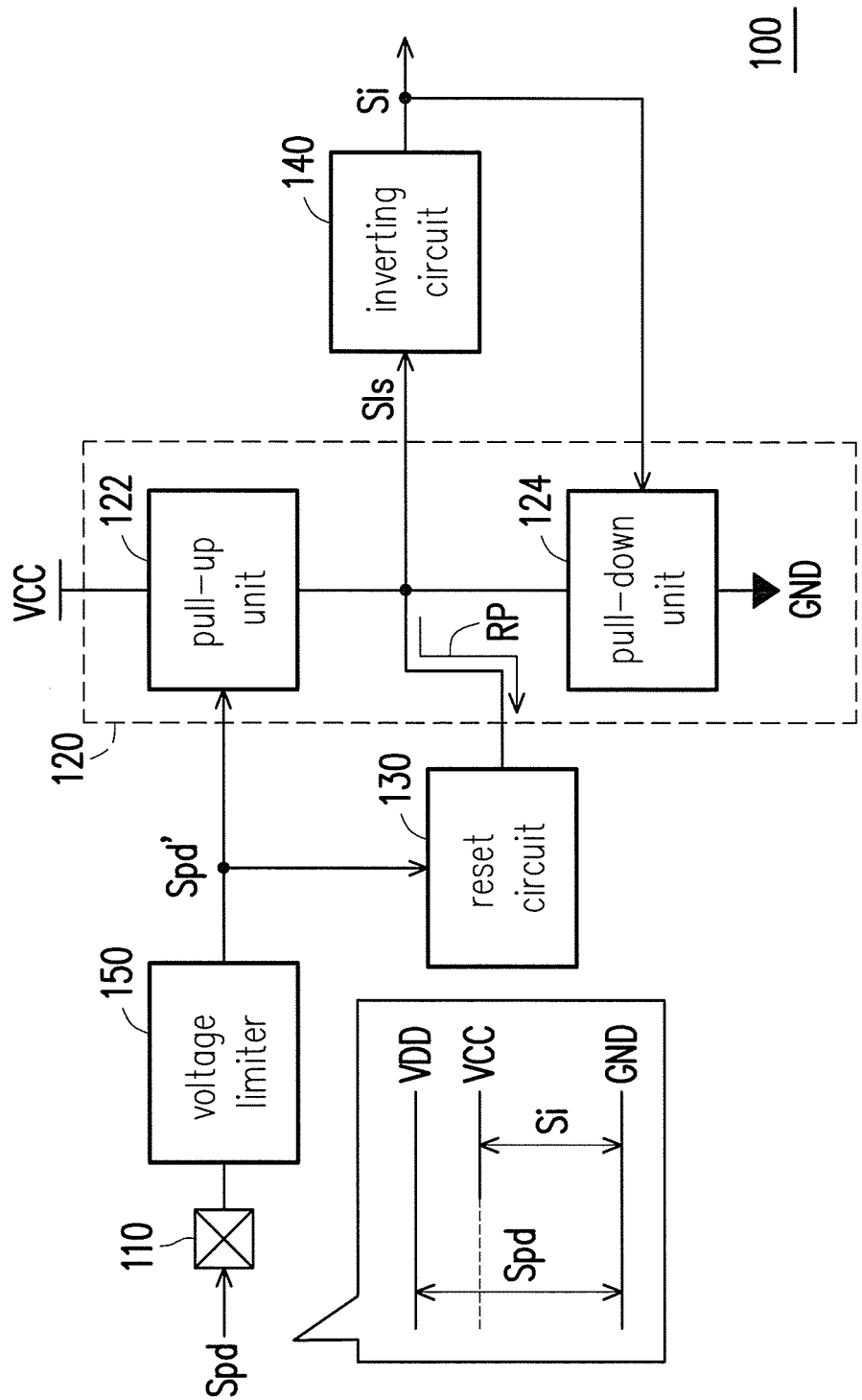
FIG. 1 illustrates a block diagram of a receiver circuit according to an embodiment of the disclosure.

In order to make the disclosure more comprehensible, embodiments are described below as examples showing that the disclosure can actually be realized. The embodiments provided herein are only for an illustrative purpose, instead of limiting the scope of the disclosure. Moreover, wherever possible, the same reference numbers are used in the drawings and the description of embodiments to refer to the same or like parts.

FIG. 1 is a block diagram of a receiver circuit according to an embodiment of the disclosure. In the present embodiment, a receiver circuit 100 is configured to receive an external signal Spd and provide an internal signal Si in response. The external signal Spd is inverted to the internal signal Si, and the internal signal Si has a different voltage swing range from the external signal Spd. In the exemplary embodiment, the external signal Spd has a voltage swing range between a supply voltage VDD and a ground voltage GND, and the internal signal Si has a voltage swing range between a supply voltage VCC and the ground voltage GND, where the supply voltage VDD is higher than the supply voltage VCC. For example, the supply voltages VDD and VCC are 3.3 and 1.8 Volts (V), respectively. The ground voltage is the voltage of a ground terminal, such as a ground voltage of 0 V.

Referring to FIG. 1, the receiver circuit 100 includes an external terminal 110, level shifter 120, a reset circuit 130, an inverting circuit 140, and a voltage limiter 150. In the exemplary embodiment, the level shifter 120, the reset circuit 130, the inverting circuit 140, and the voltage limiter 150 can be formed by low voltage devices having an operation voltage swing between the supply voltage VCC and ground voltage GND.

The external terminal 110 is configured to receive the external signal Spd transmitting from an external circuit. The voltage limiter 150 has an input terminal and an output terminal. The input terminal of the voltage limiter 150 is coupled to the external terminal 110 to receive the external signal Spd. The output terminal of the voltage limiter 150 is coupled to the level shifter 120 and the reset circuit 130. The voltage limiter 150 is configured to limit a voltage swing of the external signal Spd and output a limited external signal Spd' to the level shifter 120 and the reset circuit 130. In an exemplary embodiment, the voltage limiter 150 can be constituted by two transistors (not shown) and a boost circuit (not shown), but the present invention is not limited thereto.

The level shifter 120 is configured to shift the voltage swing range of the limited external signal Spd' to generate a level shifting signal S1s. In the present embodiment, the level shifter 120 can be implemented by a level down shifter. The level shifter 120 includes a pull-up unit 122 and a pull-down unit 124. In detail, the pull-up unit 122 is coupled to the external terminal 110 through the voltage limiter 150 to receive the limited external signal Spd'. The pull-down unit 124 is coupled to the reset circuit 130 and the inverting circuit 140 to receive the internal signal Si. In addition, the pull-up unit 122 and the pull-down unit 124 are coupled in series. In the level shifter 120, the pull-up unit 122 is turned on or off in response to the state of the limited external signal Spd', and the pull-down unit 124 is turned on or off in response to the state of the internal signal Si.

In other words, since the state of the internal signal Si is substantially inverted from the external signal Spd, the pull-up unit 122 and the pull-down unit 124 are alternatively switched respectively according to the limited external signal Spd' and the internal signal Si. Therefore, a leakage path formed when the pull-up unit 122 and the pull-down unit 124 are simultaneously turned on may be cut off by alternatively switching the pull-up unit 122 and the pull-down unit 124, and thus reduce the power loss through the level shifter 120.

The reset circuit 130 is coupled to the external terminal 110 through the voltage limiter 150 and the level shifter 120. The reset circuit 130 is configured to provide a reset path RP according to the limited external signal Spd' for assisting the switching of the pull-up unit 122 and the pull-down unit 124. The inverting circuit 140 is coupled to the level shifter 120 and inverts the level shifting signal S1s to generate the internal signal Si.

To be specific, during the operation of the receiver circuit 100, when the external signal Spd is at a high state (e.g., supply voltage VDD), the pull-up unit 122 is first turned on in response to the limited external signal Spd', so as to pull the level shifting signal S1s up to the high state (e.g., supply voltage VCC). Besides, the reset circuit 130 cuts off the reset path RP in response to the high state of the limited external signal Spd'. After the inverting circuit 140 generates the internal signal Si according to the level shifting signal S1s, the pull-down unit 124 is turned off in response to a low state of the internal signal Si (e.g., ground voltage GND). Therefore, the leakage path of the level shifter 120 can be cut off by the pull-down unit 124 being turned-off.

On the other hand, when the external signal Spd is at a low state, the pull-up unit 122 is turned-off and the reset circuit 130 provides the reset path RP, respectively, in response to the limited external signal Spd', so as to pull the level shifting signal S1s down to the low state (e.g., ground voltage GND). After the reset path RP is provided as to pull the level shifting signal S1s down to the ground voltage GND, the inverting circuit 140 generates the internal signal Si at the high state according to the level shifting signal S1s having the ground voltage GND and turns the pull-down unit 124 on to reset the level shifter 120. Therefore, the leakage path of the level shifter 120 can be cut off by the pull-up unit 122 being turned-off.

More specifically, since the pull-up unit 122 and the pull-down unit 124 are alternatively switched and are not simultaneously being turned on, so that the leakage path of the level shifter 120 is always being cut off.

Figure 2:
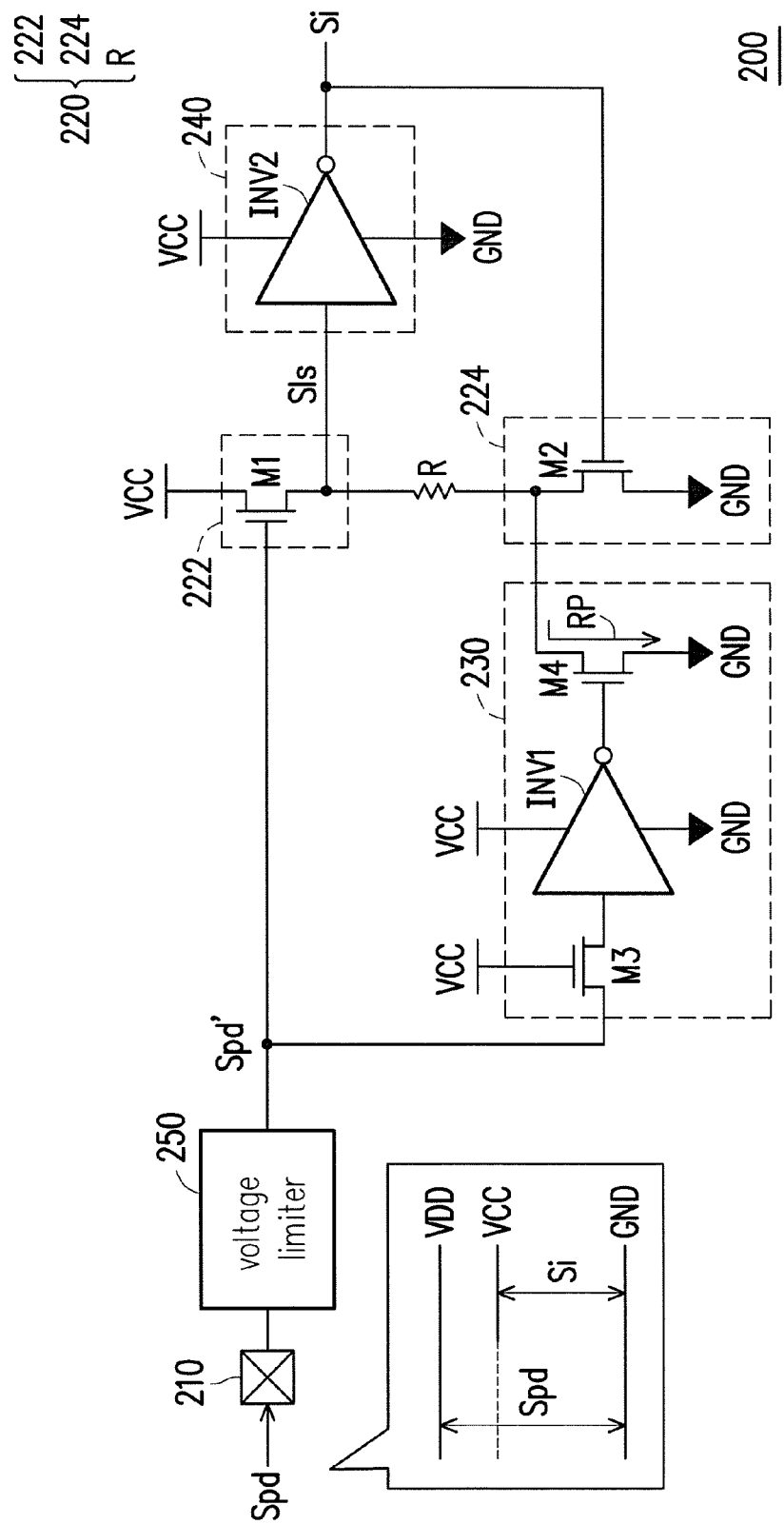
FIG. 2 illustrates a circuit diagram of the receiver circuit according to an embodiment of the disclosure.

FIG. 2 illustrates a circuit diagram of the receiver circuit according to an embodiment of the disclosure. Referring to FIG. 2, the receiver circuit 200 includes an external terminal 210, a level shifter 220, a reset circuit 230, an inverting circuit 240, and a voltage limiter 250. In the present embodiment, the level shifter 220 can be implemented by transistors M1 and M2 and a resistor R, where the transistor M1 forms a pull-up unit 222 and the transistor M2 forms a pull-down unit 224. The reset circuit 230 can be implemented by transistors M3 and M4 and an inverter INV1. The inverting circuit 240 can be implemented by an inverter INV2. Moreover, the transistors M1 to M4 can be implemented by n-channel MOS transistors, and each of the transistors M1 to M4 has a first terminal (e.g., drain), a second terminal (e.g., source), and a control terminal (e.g., gate), but the present invention is not limited thereto.

In the level shifter 220, the drain of the transistor M1 is coupled to the supply voltage VCC. The source of the transistor M1 is coupled to an input terminal of the inverter INV2 operated between the supply voltage VCC and the ground voltage GND for outputting the level shifting signal S1s. The gate of the transistor M1 is coupled to the external terminal 210 via the voltage limiter 250. A first terminal of the resistor R is coupled to the source of the transistor M1. The drain of the transistor M2 is coupled to a second terminal of the resistor R. The source of the transistor M2 is coupled to a ground terminal with the ground voltage GND. In addition, the gate of the transistor M2 is coupled to an output terminal of the inverter INV2 for receiving the internal signal Si.

In the reset circuit 230, the drain of the transistor M3 is coupled to the external terminal via the voltage limiter 250. The gate of the transistor M3 is coupled to the supply voltage VCC. The source of the transistor M3 is coupled to an input terminal of the inverter INV1. The inverter INV1 is operated between the supply voltage VCC and the ground voltage GND. The drain of the transistor M4 is coupled to the second terminal of the resistor R and the drain of the transistor M2. The source of the transistor M4 is coupled to the ground terminal GND. The gate of the transistor M4 is coupled to an output terminal of the inverter INV1. In the present embodiment, a reset path RP is provided via the transistor M4 being turned-on, and the reset path RP is cut off by the transistor M4 being turned-off. In other words, the transistor M4 forms the reset path RP.

In the inverting circuit 240, the inverter INV2 receives the level shifting signal S1s from the input terminal and inverts the level shifting signal S1s to output the internal signal Si from the output terminal.

Figure 3A:
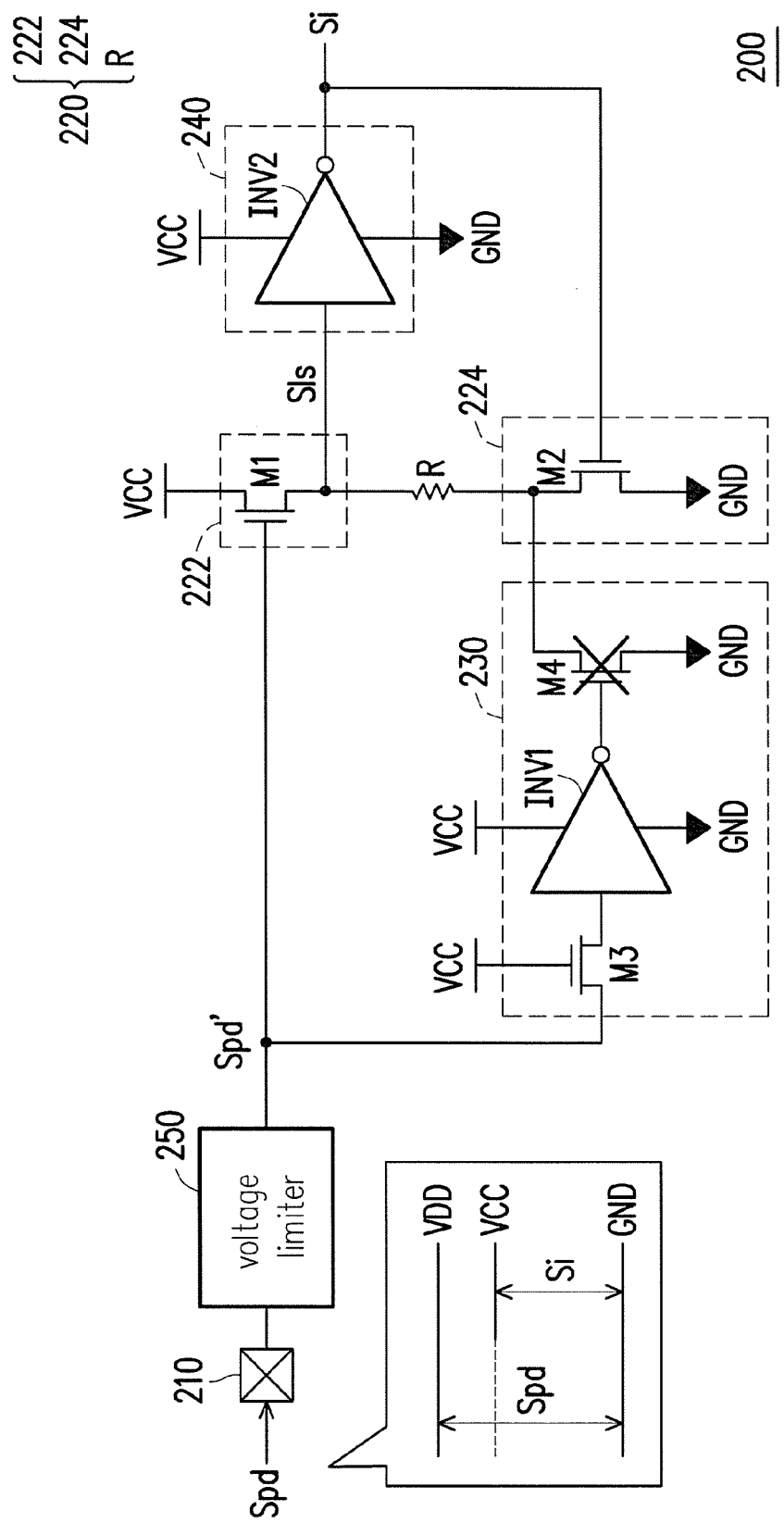
FIG. 3A to FIG. 3C illustrate equivalent circuit diagrams of a receiver circuit switching from low state to high state according to an embodiment of the disclosure.
Figure 3B:
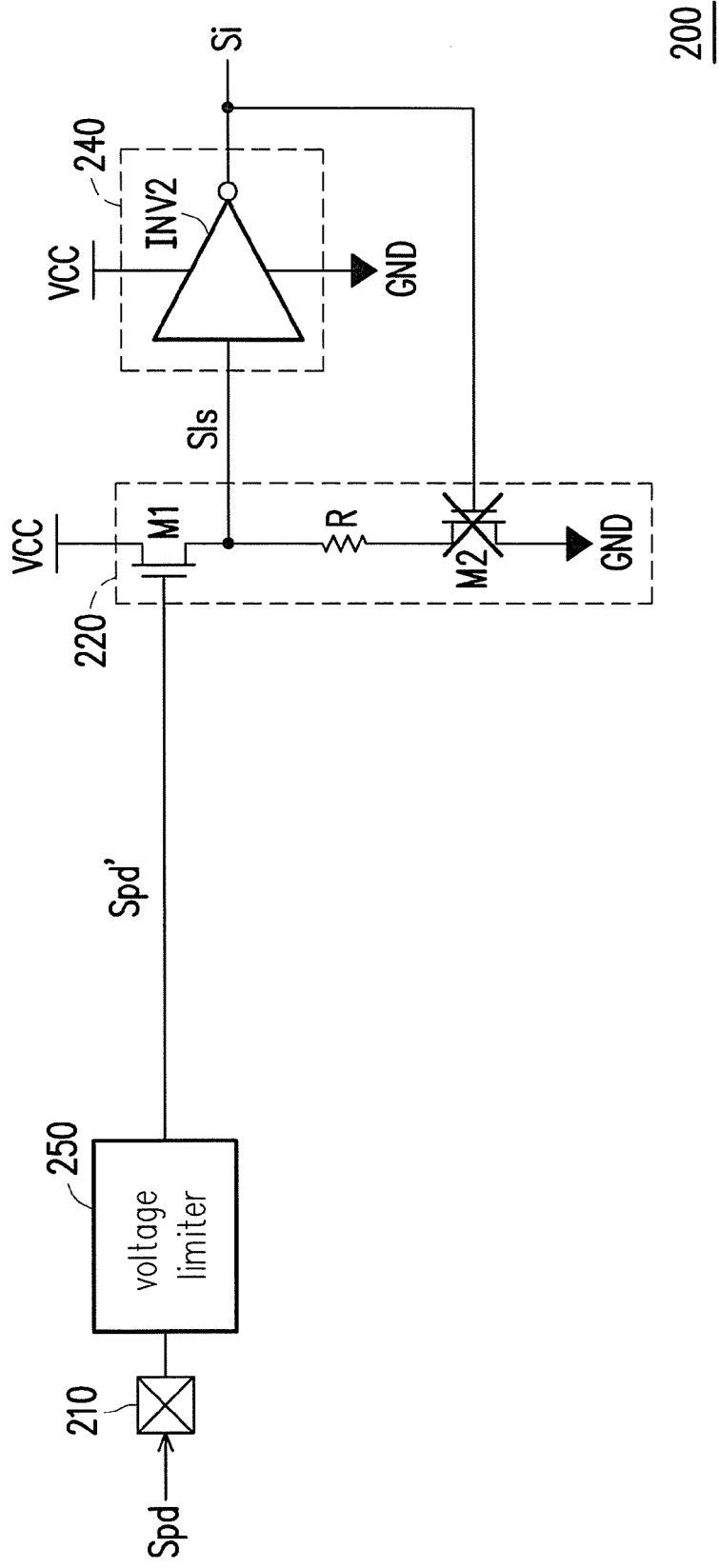
Figure 3C:
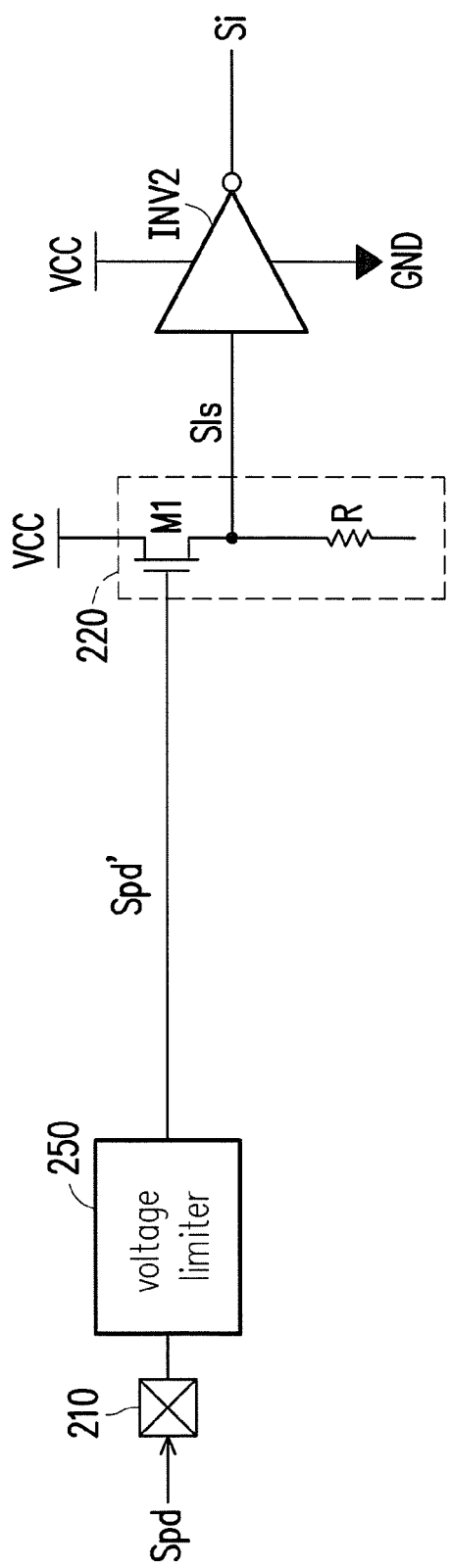
Figure 4:
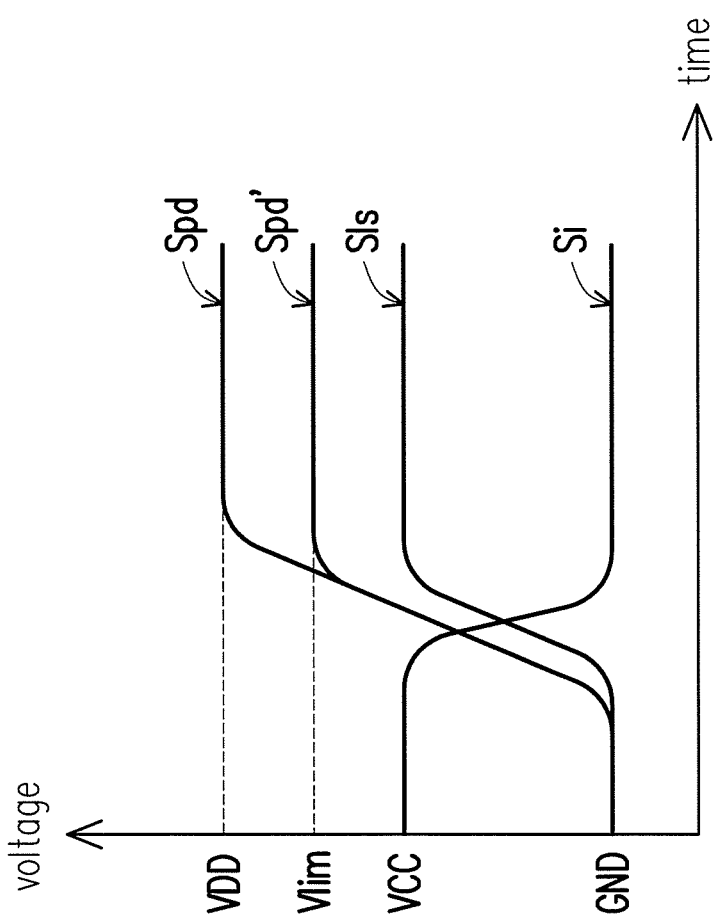
FIG. 4 illustrates signal waveforms of the receiver circuit according to the embodiment illustrated in FIG. 3A to FIG. 3C.

In view of the signal timing waveforms, operation of the receiver circuit 200 can be described as follows. FIG. 3A to FIG. 3C illustrate equivalent circuit diagrams of a receiver circuit switching from low state to high state according to an embodiment of the disclosure. FIG. 4 illustrates signal waveforms of the receiver circuit according to the embodiment illustrated in FIG. 3A to FIG. 3C.

Referring to FIG. 3A and FIG. 4, when the external signal Spd switches from the low state (e.g., ground voltage GND) to the high state (e.g., supply voltage VDD), the voltage limiter 250 directly transmits the received external signal Spd to the level shifter 220 and the reset circuit 230 as the limited external signal Spd' when a voltage level of the external signal Spd is lower than a limited voltage Vlim (e.g., 2.8V). When the voltage level of the external signal Spd rises higher than the limited voltage Vlim, the voltage limiter 250 may keep the voltage level of the external signal Spd at the limited voltage Vlim and output it as the limited external signal Spd'. In other words, during a period of a rising edge of the external signal Spd, the voltage limiter 250 tracks (or monitors) the external signal Spd. In detail, when the external signal Spd approaches the limited voltage Vlim, the voltage level of the external signal Spd is limited to the limited voltage Vlim and outputted as the limited external signal Spd'.

Next, the limited external signal Spd' at the high state is transmitted to the gate of the transistor M1, which turns on the transistor M1. At the same time, the limited external signal Spd' at the high state is transmitted to the input terminal of the inverter INV1 via the transistor M3, where the inverter INV1 inverts the limited external signal Spd' and outputs a signal at the low state to turn off the transistor M4 coupled to the output terminal of the inverter INV1. In other words, under the equivalent circuit configuration, the transistor M4 is turned off in response to the output of the inverter INV1, so as to cut off the reset path RP.

Referring to FIG. 3B and FIG. 4, after the reset path RP has been cut off and the transistor M1 has been turned on, the turned-on transistor M1 causes the level shifting signal S1s to rise toward the supply voltage VCC from the ground voltage GND and substantially keep at the supply voltage VCC. The inverter INV2 then inverts the level shifting signal S1s to generate the internal signal Si at the low state and feedback the internal signal Si to the gate of the transistor M2, which turns off the transistor M2 in response to the internal signal Si at low level.

Referring to FIG. 3C and FIG. 4, in the equivalent circuit configuration, the transistor M1 is turned on, so as to pull the internal signal Si down to the low state (e.g., ground voltage GND) in response to the external signal Spd at the high state (e.g., supply voltage VDD). The leakage path of the level shifter 220 is cut off since the transistors M2 and M4 are turned off.

Figure 5A:
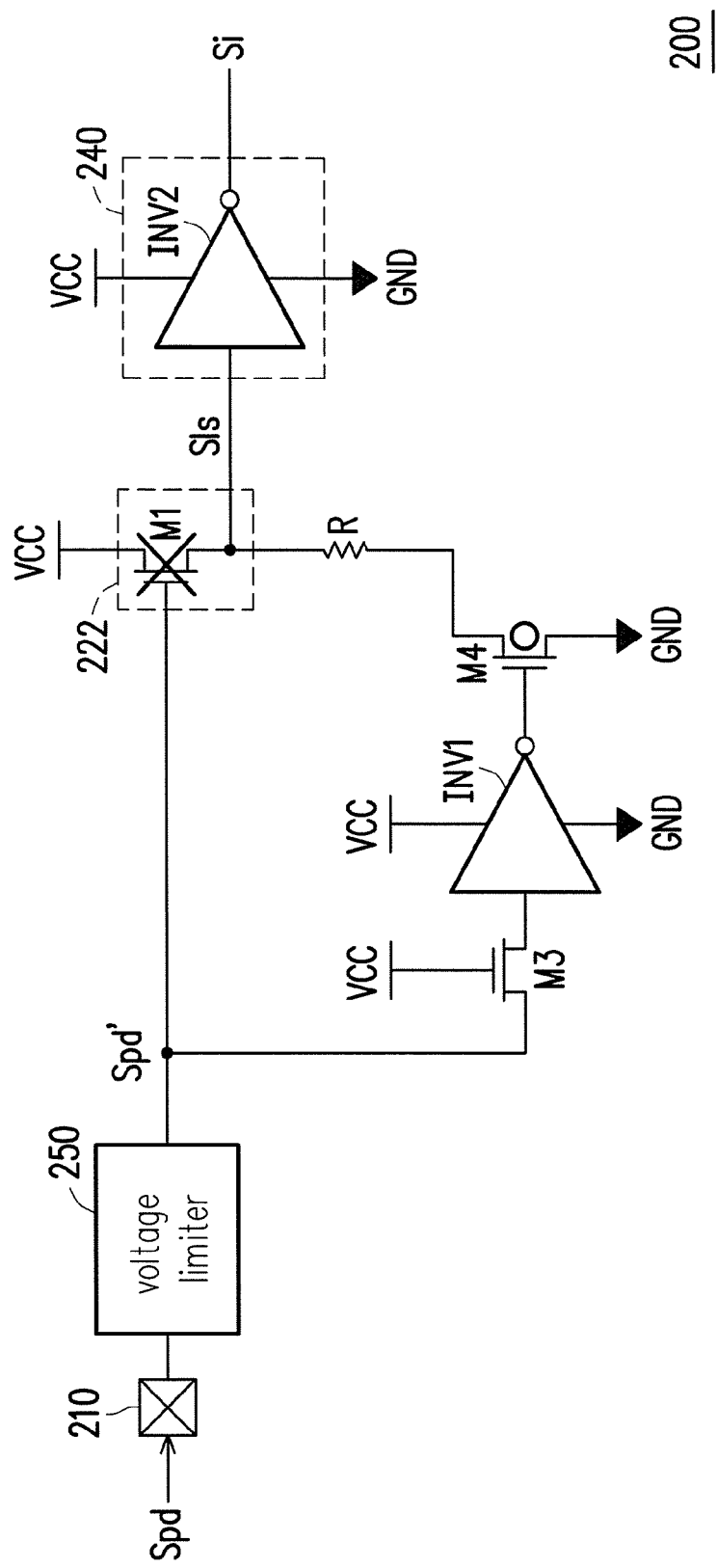
FIG. 5A to FIG. 5B illustrate equivalent circuit diagrams of a receiver circuit switching from high state to low state according to an embodiment of the disclosure.
Figure 5B:
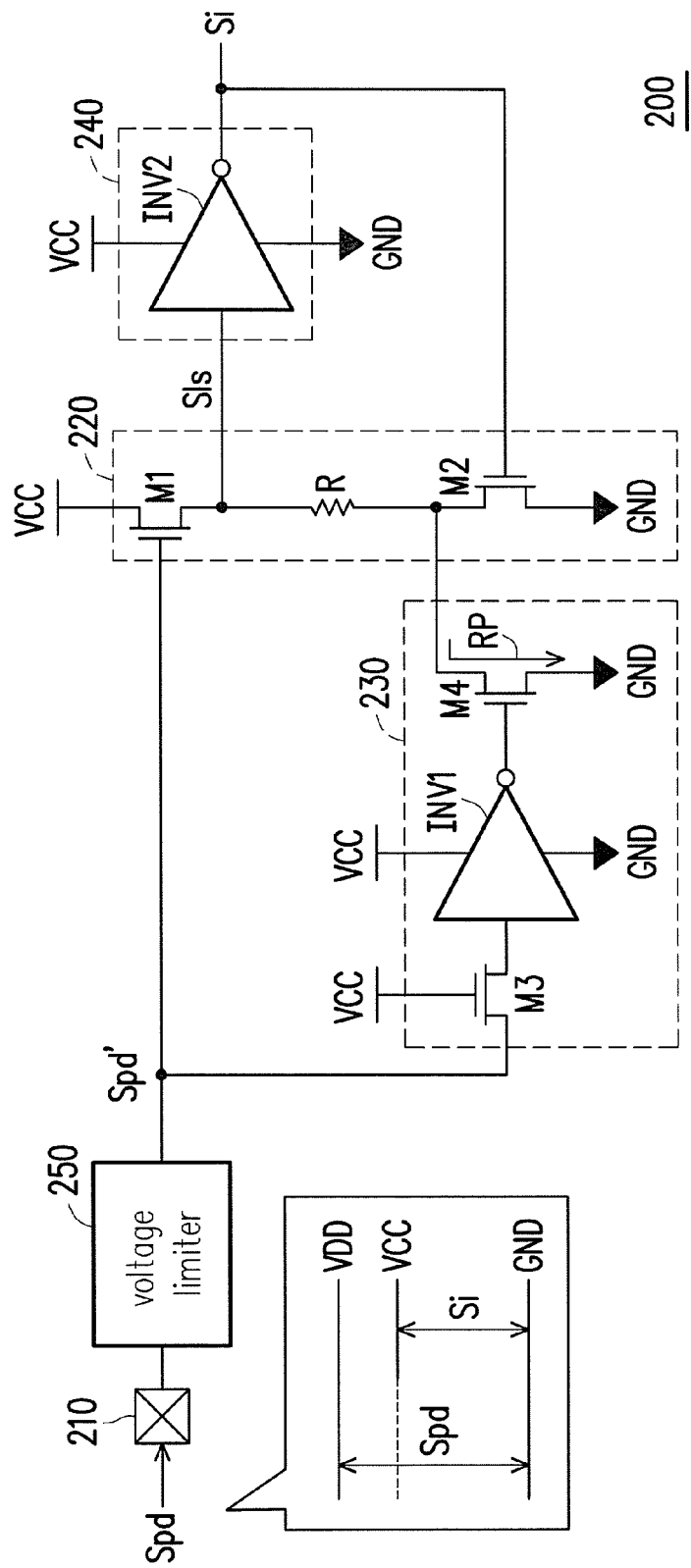
Figure 6:
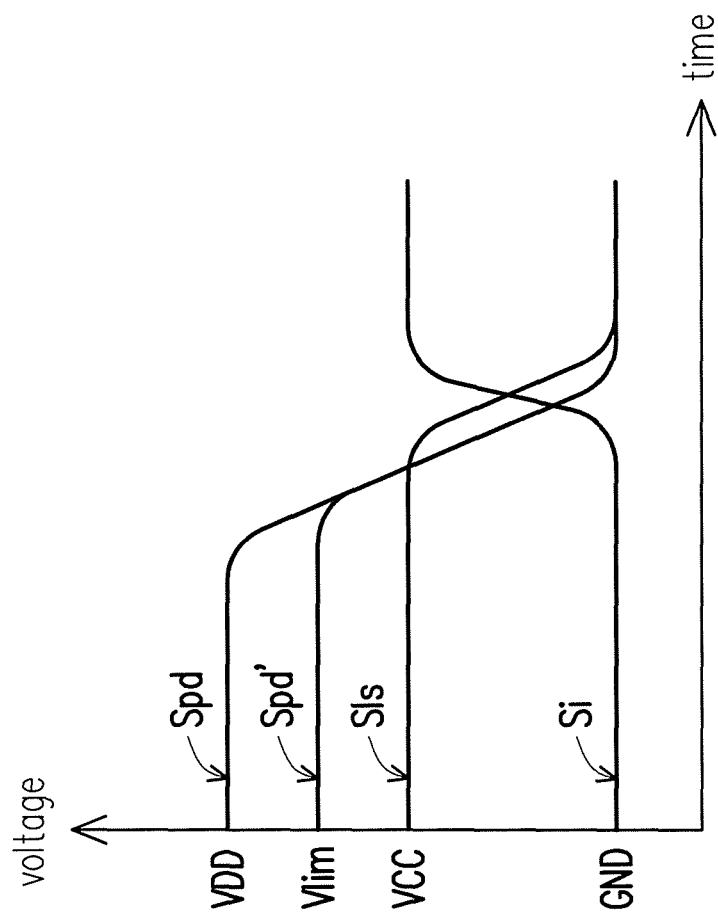
FIG. 6 illustrates signal waveforms of the receiver circuit according to the embodiment illustrated in FIG. 5A to FIG. 5B.

FIG. 5A to FIG. 5B illustrate equivalent circuit diagrams of a receiver circuit switching from high state to low state according to an embodiment of the disclosure. FIG. 6 illustrates signal waveforms of the receiver circuit according to the embodiment illustrated in FIG. 5A to FIG. 5B.

Referring to FIG. 5A and FIG. 6, when the external signal Spd switches from the high state (e.g., supply voltage VDD) to the low state (e.g., ground voltage GND), the voltage level of the limited external signal Spd' generated by the voltage limiter 250 is fallen from the limited voltage Vlim to the ground voltage GND.

Next, the limited external signal Spd' at the low state is transmitted to the gate of the transistor M1, which turns off the transistor M1. At the same time, the limited external signal Spd' is transmitted to the input terminal of the inverter INV1 via the transistor M3, where the inverter INV1 inverts the limited external signal Spd' at the low state and outputs a signal at the high state to turn on the transistor M4. In other words, under the equivalent circuit configuration illustrated in FIG. 5A, the transistor M4 is turned on in response to the output of the inverter INV1, so as to provide the reset path RP. It should be noted that, at the moment (i.e., the beginning of the switching the external signal Spd from the high state to the low state), the transistor M2 (not shown in FIG. 5A) is still in a turn-off state because the internal signal Si has not been pulled up to the high state yet.

Referring to FIG. 5B and FIG. 6, after the reset path RP has been provided and the transistor M1 has been turned off, the turned-on transistor M4 causes the voltage level shifting signal S1s to drop toward the ground voltage GND from the supply voltage VCC and substantially keep at the ground voltage GND. The inverter INV2 then inverts the level shifting signal S1s to generate the internal signal Si at the high state and feedback the internal signal Si to the gate of the transistor M2, so as to turn the transistor M2 on in response to the internal signal Si. In the equivalent circuit configuration illustrated in FIG. 5B, the transistor M1 is turned off and the transistors M2 and M4 are turned on, so as to pull the internal signal Si up to the high state (e.g., supply voltage VCC) in response to the external signal Spd at the low state (e.g., ground voltage GND). The leakage path of the level shifter 220 is cut off since the transistor M1 is turned off.

It should be noted that the threshold voltage of the transistor M1 has been neglected in the aforementioned equivalent circuit configuration, but the present invention is not limited thereto. If the threshold voltage of the transistor M1 is taken into consideration, the voltage level of the level shifting signal S1s should be kept at about 0.4 V.

In summary, the embodiments of the present invention provides a receiver circuit capable of converting an external signal into an internal signal with low leakage by utilizing a level shifter having a pull-up unit and a pull-down unit. Since the pull-up unit and the pull-down unit are alternatively switched in response to the external signal and the internal signal, the leakage path of the level shifter can be always cut off and thus reduce the power loss leaked through the level shifter.

It is noted that the above-mentioned receiver circuit may be applied in any chip operated in, for example, a low voltage of 1.8V, but the present invention is not limited thereto. In addition, other exemplary embodiments (for example, changing the n-channel MOS transistors to the p-channel MOS transistors) would fall within the scope of the present invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A receiver circuit receiving an external signal and providing an internal signal in response, the receiver circuit comprising:
   an external terminal configured to receive the external signal;
   a level shifter configured to shift a voltage swing range of the external signal to generate a level shifting signal, and comprising a pull-up unit and a pull-down unit coupled in series, wherein the pull-up unit and the pull-down unit are alternatively switched according to the external signal and the internal signal, respectively, and thus a leakage path of the level shifter is cut off during different states of the external signal;
   a reset circuit coupled to the external terminal and the level shifter and configured to provide a reset path according to the external signal for assisting the switching of the pull-up unit and the pull-down unit; and
   an inverting circuit coupled to the level shifter and inverting the level shifting signal to generate the internal signal.

2. The receiver circuit according to claim 1, wherein when the external signal is at a first state, the pull-up unit is turned on and the reset circuit is cut off the reset path in response to the external signal, and the pull-down unit is turned off in response to the internal signal, so as to generate the level shifting signal having a first supply voltage, and wherein when the external signal is at a second state, the pull-up unit is turned off and the reset path is provided by the reset circuit in response to the external signal, and the pull-down unit is turned on in response to the internal signal after the reset path being provided, so as to generate the level shifting signal having a ground voltage.

3. The receiver circuit according to claim 2, wherein the external signal has a first voltage swing range and the internal signal has a second voltage swing range, the first voltage swing range is defined by a second supply voltage and the ground voltage, and the second voltage swing range is defined by the first supply voltage and the ground voltage.

4. The receiver circuit according to claim 3, wherein the first state of the external signal corresponds to the second supply voltage and the second state of the external signal corresponds to the ground voltage.

5. The receiver circuit according to claim 3, wherein the first supply voltage is less than the second supply voltage, and the receiver circuit is applied in a chip operated in the first supply voltage.

6. The receiver circuit according to claim 1, wherein the level shifter comprises:
   a first transistor, having a first terminal coupled to a first supply voltage, a second terminal coupled to the inverting circuit for outputting the level shifting signal, and a control terminal coupled to the external terminal, wherein the first transistor forms the pull-up unit;
   a resistor, having a first terminal coupled to the second terminal of the first transistor; and
   a second transistor, having a first terminal coupled to a second terminal of the resistor, a second terminal coupled to a ground terminal with a ground voltage, and a control terminal coupled to the inverting circuit for receiving the internal signal, wherein the second transistor forms the pull-down unit.

7. The receiver circuit according to claim 6, wherein the reset circuit comprises:
   a third transistor, having a first terminal coupled to the external terminal and a control terminal coupled to the first supply voltage;
   a first inverter, having an input terminal coupled to a second terminal of the third transistor; and
   a fourth transistor, having a first terminal coupled to the second terminal of the resistor and the first terminal of the second transistor, a second terminal coupled to the ground terminal, and a control terminal coupled to an output terminal of the first inverter, wherein the fourth transistor forms the reset path.

8. The receiver circuit according to claim 7, wherein when the external signal is in a first state, the fourth transistor is turned off in response to output of the first inverter so as to cut off the reset path, and when the external signal is in a second state, the fourth transistor is turned on in response to the output of the first inverter so as to provide the reset path.

9. The receiver circuit according to claim 7, wherein the inverting circuit comprises:
   a second inverter, having an input terminal coupled to the second terminal of the first transistor and the first terminal of the resistor and an output terminal coupled to the control terminal of the second transistor for outputting the internal signal.

10. The receiver circuit according to claim 1, further comprising:
   a voltage limiter, having an input terminal coupled to the external terminal and an output terminal coupled to the level shifter and the reset circuit, wherein the voltage limiter limits a voltage swing of the external signal and outputs a limited external signal to the level shifter and the reset circuit.

* * * * *